United States Patent [19]

Nagasawa et al.

[11] Patent Number: 5,028,975
[45] Date of Patent: Jul. 2, 1991

[54] SEMICONDUCTOR DEVICES AND A PROCESS FOR PRODUCING THE SAME

[75] Inventors: Kouichi Nagasawa, Kunitachi; Yoshio Sakai, Hachiohji; Osamu Minato, Kodaira; Toshiaki Masuhara, Tokyo; Satoshi Meguro, Kodaira, all of Japan

[73] Assignee: Hitachi, Ltd., Tokyo, Japan

[21] Appl. No.: 527,641

[22] Filed: May 23, 1990

Related U.S. Application Data

[63] Continuation of Ser. No. 247,506, Sep. 22, 1988, abandoned, which is a continuation of Ser. No. 634,037, Jul. 24, 1984, Pat. No. 4,792,871, which is a continuation of Ser. No. 288,466, Jul. 30, 1981, abandoned.

[30] Foreign Application Priority Data

Aug. 15, 1980 [JP] Japan .................. 55-111705

[51] Int. Cl.$^5$ ............ H01L 27/02; H01L 29/04; H01L 23/48; G11C 11/34
[52] U.S. Cl. ............ 357/41; 357/51; 357/59; 357/42; 357/71; 365/182
[58] Field of Search ........... 357/59 F, 59 G, 59 J, 357/59 K, 71 P, 51, 41, 42; 365/182

[56] References Cited

U.S. PATENT DOCUMENTS

| | | | |
|---|---|---|---|
| 4,125,854 | 11/1978 | McKenny | 357/41 |
| 4,198,695 | 4/1980 | McElroy | 365/154 |
| 4,234,889 | 11/1980 | Raymond et al. | 357/59 F |
| 4,558,343 | 12/1985 | Ariizumi et al. | 357/59 J |

FOREIGN PATENT DOCUMENTS

| | | |
|---|---|---|
| 2700873 | 7/1977 | Fed. Rep. of Germany . |
| 2809233 | 9/1978 | Fed. Rep. of Germany . |
| 2818525 | 11/1978 | Fed. Rep. of Germany . |
| 2947311 | 5/1980 | Fed. Rep. of Germany . |
| 3123348 | 6/1981 | Fed. Rep. of Germany . |
| 54-40580 | 3/1979 | Japan . |

OTHER PUBLICATIONS

IEEE Journal of Solid State Circuits, vol. 15, #2, pp. 201-205 by Ohzone et al., Apr. 1980.
Kang et al., "A 30 ns 16×1 Fully Static RAM", 1981, IEEE International Solid State Circuits Conference, pp. 18, 19 and 255, Feb. 18, 1981.

*Primary Examiner*—Mark Prenty
*Attorney, Agent, or Firm*—Antonelli, Terry, Stout & Kraus

[57] ABSTRACT

Disclosed is an MOSIC including a plurality of silicon gate type MOSFET's in which, after polycrystalline silicon wirings are formed simultaneously with polycrystalline silicon gates, the electrodes contacted with the source and drain regions are made of polycrystalline silicon so as to be connected to the polycrystalline silicon wirings, thereby to prevent the shallow pn junctions of the source and drain regions from being destroyed by the contacts and to provide a high degree of integration to one silicon chip.

61 Claims, 8 Drawing Sheets

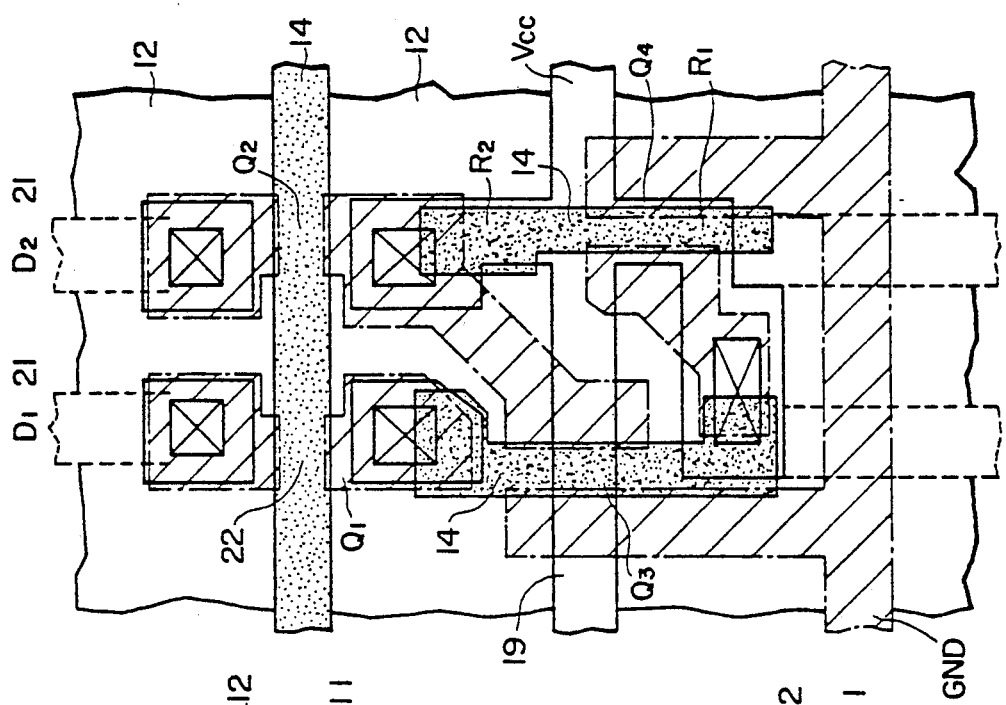
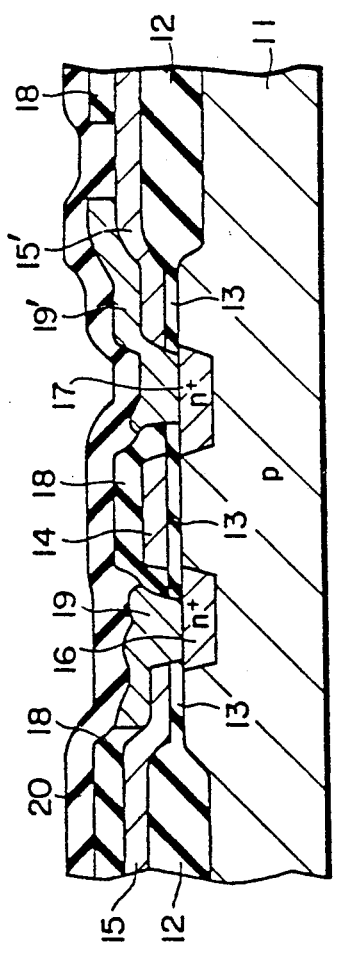

SEMICONDUCTOR DEVICES AND A PROCESS FOR PRODUCING THE SAME

This application is a continuation of application Ser. No. 07/247,506, filed on Sept. 22, 1988 and now abandoned which is a continuation of application Ser. No. 634,037, filed July 24, 1984 and now U.S. Pat. No. 4,792,871, which is a continuation application of Ser. No. 288,466, filed July 30, 1981, now abandoned.

BACKGROUND OF THE INVENTION

The present invention relates to semiconductor devices and a process for producing the same. In particular, the invention relates to static memory semiconductor devices employing FET's (field effect transistors) and a process for producing them.

A memory portion of a static memory semiconductor device consists of a plurality of memory cells, each memory cell being made up of a plurality of MOS FET's. In a static memory cell of this type, the electrode has heretofore been connected to the source region or to the drain region of the MOS FET by using an aluminum wiring. However, since the memory portion occupies a very wide area in a chip in which the static memory semiconductor device is formed, the area occupied by the memory portion must be reduced if it is desired to increase the degree of integration of the semiconductor devices. In an attempt to reduce the area of the memory portion or to reduce the size of the memory cell, therefore, attempts have been made to connect a wiring 8 of polycrystalline silicon directly to the source region or the drain region 7 that is surrounded by a field $SiO_2$ film 5 and a polycrystalline silicon gate 6, as shown in FIGS. 1 and 2. However, the polycrystalline silicon wiring 8 is composed of a first layer that is formed simultaneously with the polycrystalline silicon gate 6, and is usually doped with phosphorus ions of a high concentration to reduce the resistance. The phosphorus ions are doped simultaneously with the formation of the source region and the drain region. While the phosphorus ions are being doped, the depth of an $n^+$-type diffusion layer 7 increases beneath the polycrystalline silicon wiring. Namely, the diffusion layer 7 swells beneath the polycrystalline silicon gate 6 as indicated by a dotted line 10 in FIG. 2, and it becomes difficult to obtain an MOSFET having a desired channel length or a desired shallow source region or drain region. To prevent this defect, a sufficient distance $d_1$ must be provided between an end portion of the polycrystalline silicon gate 6 and an end portion of the polycrystalline silicon wiring 8. This, however, contradicts the purpose of reducing the size of the cell; the degree of integration of the semiconductor devices is not increased.

Therefore, the inventors of the present invention have developed a method by which the polycrystalline silicon gate 6 and the polycrystalline silicon wiring 8 are formed as shown in FIG. 3, and are covered by an insulating film 9 such as PSG (phosphorus silicate glass).

A portion of the insulating film 9 is then selectively removed by photoetching, and an aluminum wiring 10 is formed in order to connect a semiconductor region 7 to the polycrystalline silicon wiring 8. It was, however, discovered that when the aluminum layer is brought into direct contact with the semiconductor region (source or drain region), there is formed an aluminum-silicon alloy which destroys a pn junction at a depth of as much as about 1 $\mu$m in the source or the drain region.

SUMMARY OF THE INVENTION

The present invention is to solve the above-mentioned defects and problems.

A first object of the present invention therefore is to provide an MOSFET which enables the degree of integration to be increased.

A second object of the present invention is to provide a process for producing such MOSFET's.

A third object of the present invention is to provide a memory cell having a high degree of integration.

BRIEF DESCRIPTION OF THE DRAWINGS

FIGS. 8(a) to 8(f) are section views showing the steps in a process for producing the MOSFET of FIG. 7;

FIG. 9 is a plan view of the memory cell of FIG. 5 formed in accordance with the present invention;

DESCRIPTION OF THE PREFERRED EMBODIMENTS

Figure 1:
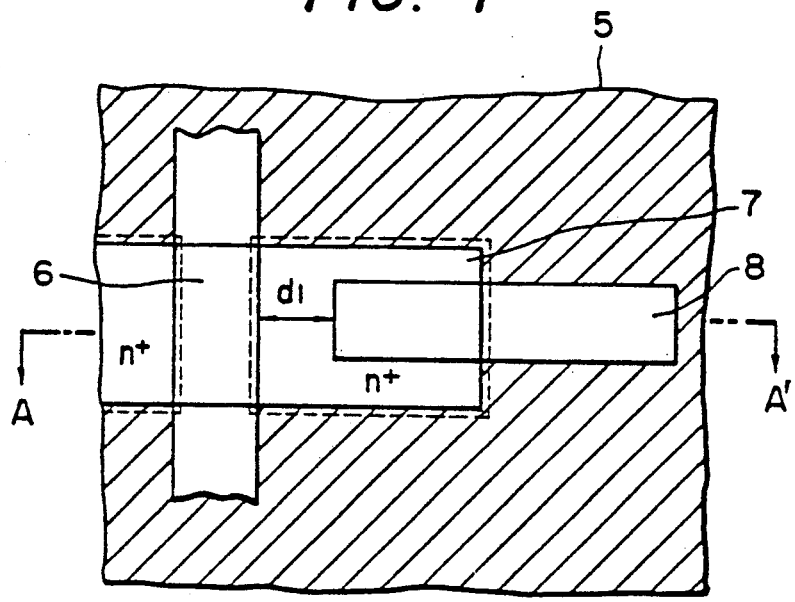
FIG. 1 is a plan view showing a portion of an MOSFET which is used for a conventional memory cell.
Figure 2:
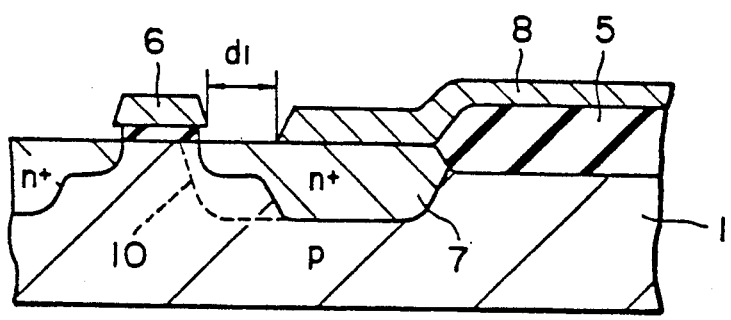
FIG. 2 is a section view along the line A—A' of FIG. 1.
Figure 3:
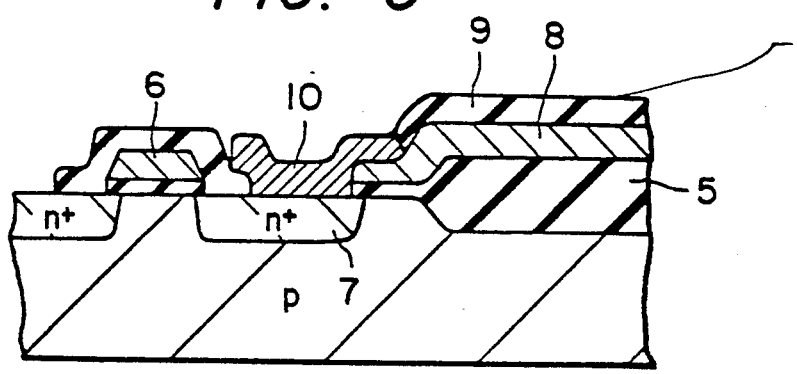
FIG. 3 is a section view of an MOSFET developed by the inventors of the present invention, which serves as a prerequisite for the present invention.
Figure 4:
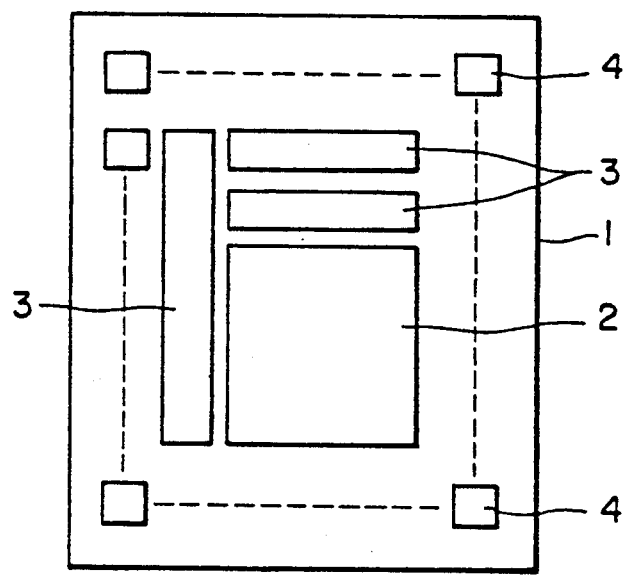
FIG. 4 is a plan view showing the construction of a static memory device according to the present invention.

Referring to FIG. 4, a static memory device according to the present invention has a memory portion (memory array) 2 which consists of a plurality of single-channel (for example, n-channel) MOSFET's formed in a well region that is formed in a portion of a silicon semiconductor chip 1. A peripheral circuit 3 consisting of complementary MOSFET's is formed by the side of the memory portion 2 to drive it. Further, a required number of bonding pads (terminals) 4 are formed in the periphery of the chip 1.

Figure 5:
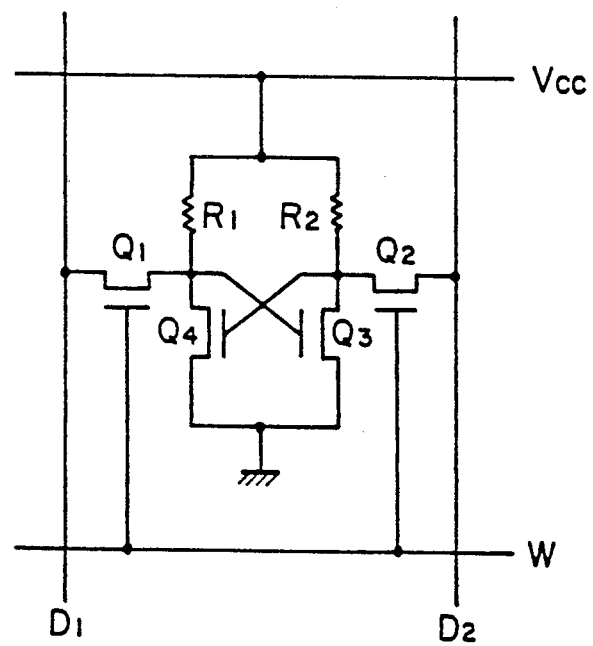
FIG. 5 is a circuit diagram of a memory cell in the memory device.

A memory cell of a single bit consists of four MOSFET's $Q_1$, $Q_2$, $Q_3$ and $Q_4$, and load resistors $R_1$ and $R_2$, as shown in FIG. 5, in which $V_{CC}$ denotes a power supply of a voltage of, for example, +5 volts, W denotes a word line, and $D_1$ and $D_2$ denote data lines.

Figure 6:
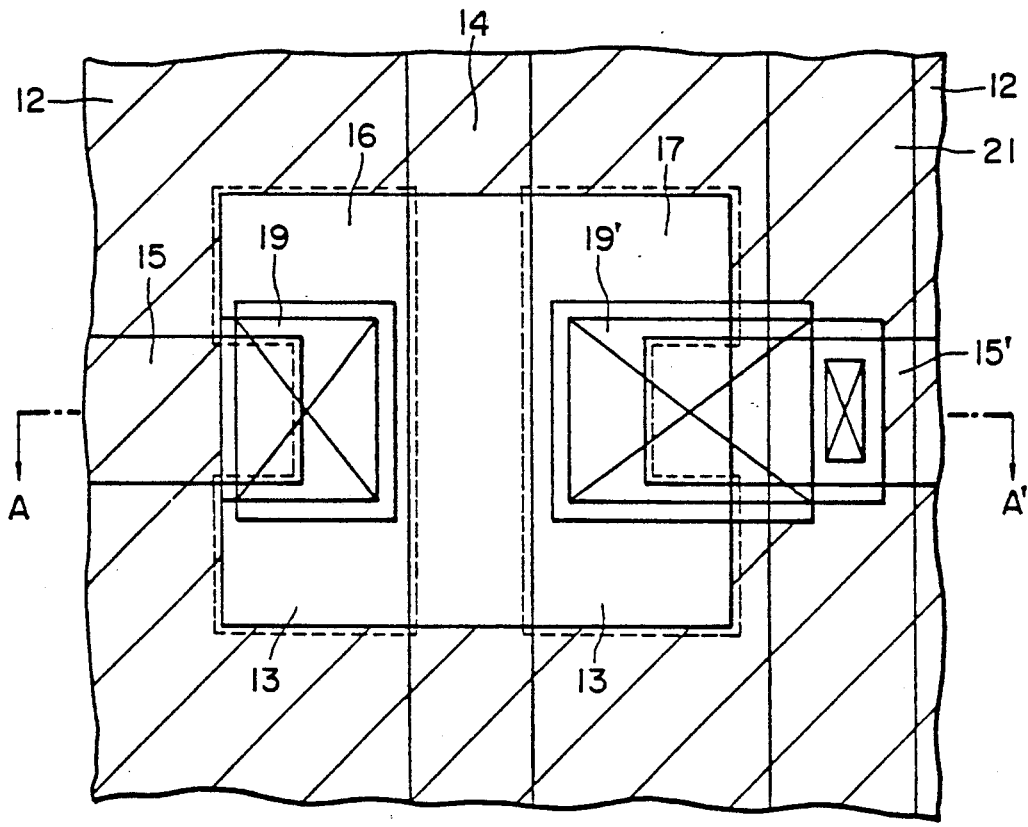
FIG. 6 is a plan view of an MOSFET according to an embodiment of the present invention.
Figure 7:
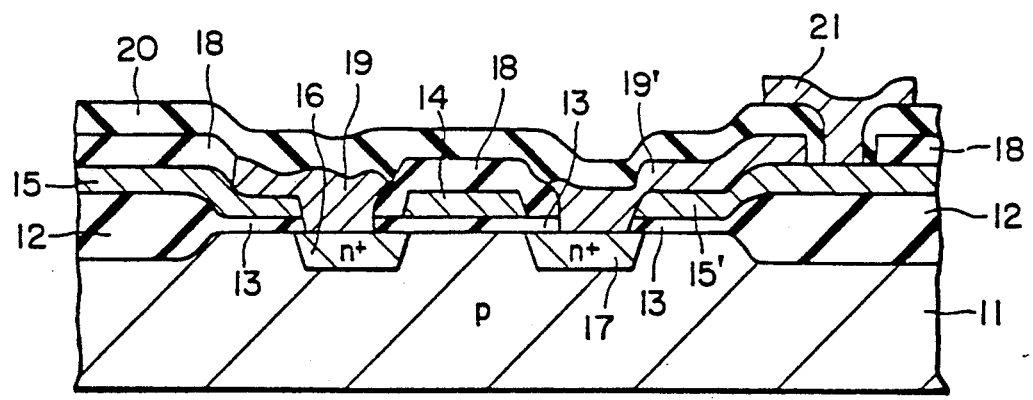
FIG. 7 is a section view of the MOSFET along the line A—A' of FIG. 6.

FIG. 6 is a plan view of an MOSFET which constitutes a memory cell of FIG. 5, and FIG. 7 is a section view along the line A—A' of FIG. 6. In FIGS. 6 and 7, an $SiO_2$ film (gate insulation film) 13 of a thickness smaller than a field $SiO_2$ film 12 is formed on the surface of a region (active region) in a portion of a p-type substrate that is surrounded by the thick field $SiO_2$ film 12. On the $SiO_2$ film 13 is selectively formed a gate polycrystalline silicon layer 14 in a manner to traverse the active region. Further, polycrystalline silicon wirings 15 and 15' of the first layer are selectively formed so as to stretch from the SiO$_2$ film 13 to the field SiO$_2$ film 12 in a direction to cross the gate polycrystalline silicon layer 14 at right angles thereto. An n$^+$-type source region 16 and an n$^+$-type drain region 17 are formed in the surface of the active region which is surrounded by the gate polycrystalline silicon layer 14, field SiO$_2$ film 12, and polycrystalline silicon wirings 15, 15' of the first layer. Further, there are formed a second polycrystalline silicon wiring layer 19 that comes into direct contact with a portion of the surface of said source region 16 and with a portion of the surface of the first polycrystalline silicon wiring layer 15, and a second polycrystalline silicon wiring layer 19' that comes into direct contact with a portion of the surface of the drain region 17 and with a portion of the surface of the first polycrystalline silicon wiring layer 15'. An aluminum wiring 21 is connected to the first polycrystalline silicon wiring layer 15'.

FIGS. 8(a) to 8(f) are section views showing the steps in a process for producing the MOSFET that is shown in FIGS. 6 and 7. The process for producing the MOSFET of FIGS. 6 and 7 will be described below in conjunction with FIGS. 8(a) to 8(f).

Figure 8A:
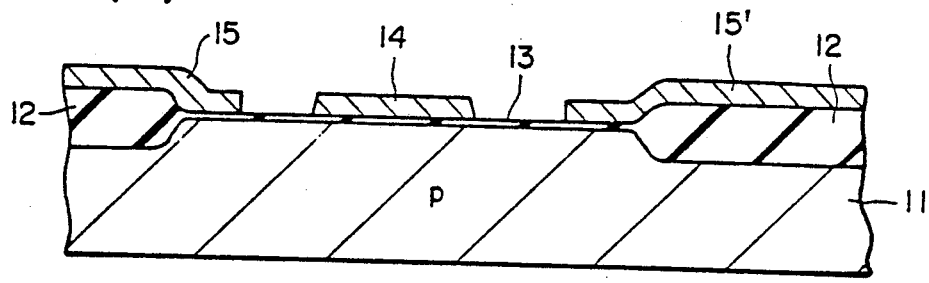

Referring to FIG. 8(a), first, a field SiO$_2$ film 12 is formed on one main surface of a p-type silicon substrate 11 by the low-temperature selective oxidation method, and an SiO$_2$ film (gate insulation film) 13 of a thickness smaller than that of the field SiO$_2$ film 12 is formed on the surface of the active region surrounded by the field SiO$_2$ film 12. Then, polycrystalline silicon is deposited on the whole surfaces of the field SiO$_2$ film 12 and the gate SiO$_2$ film 13, and is doped with phosphorus ions of a relatively high concentration to decrease its resistance. The polycrystalline silicon is then subjected to the selective photoetching, in order to form a polycrystalline silicon gate 14 and first polycrystalline silicon wiring layers 15, 15'.

Figure 8B:
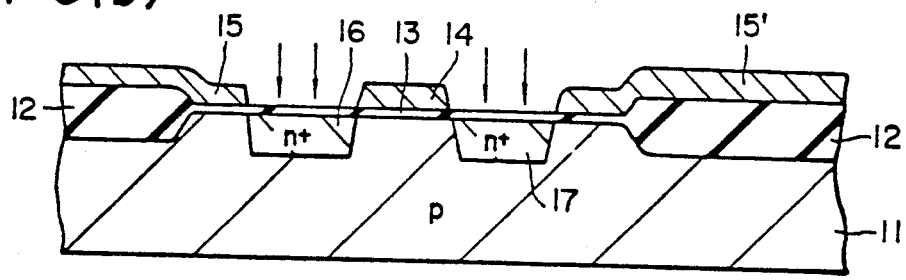

Referring to FIG. 8(b), n-type impurities are introduced into the surface of the p-type silicon substrate 11 with the polycrystalline silicon gate 14 and first polycrystalline silicon wiring layers 15, 15' as a mask, in order to form, in the p-type substrate, a semiconductor region that forms a pn junction relative to the substrate. For instance, n-type impurity ions of phosphorus or arsenic are injected into the p-type silicon substrate 11, followed by the annealing (heat treatment), to form the n$^+$-type source region 16 and drain region 17 having a desired depth in the p-type silicon substrate 11.

Figure 8C:
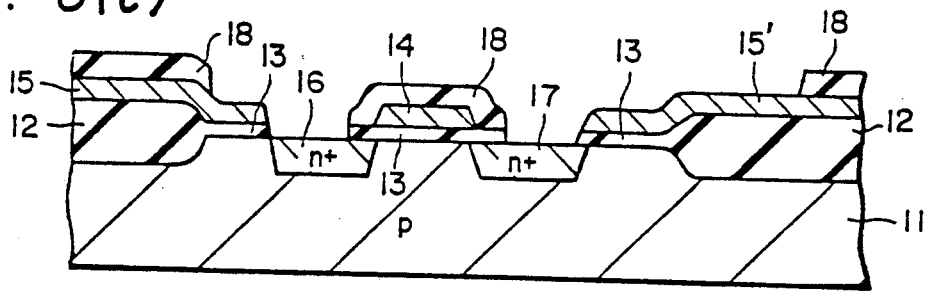

Referring to FIG. 8(c), an SiO$_2$ film 18 is formed as a first interlayer insulation film on the whole surface of the p-type substrate 11 by the thermal oxidation method or the CVD (chemical vapor deposition) method. Then, portions of the surface of the source region 16 and the drain region 17 are exposed by the contact photoetching.

Figure 8D:
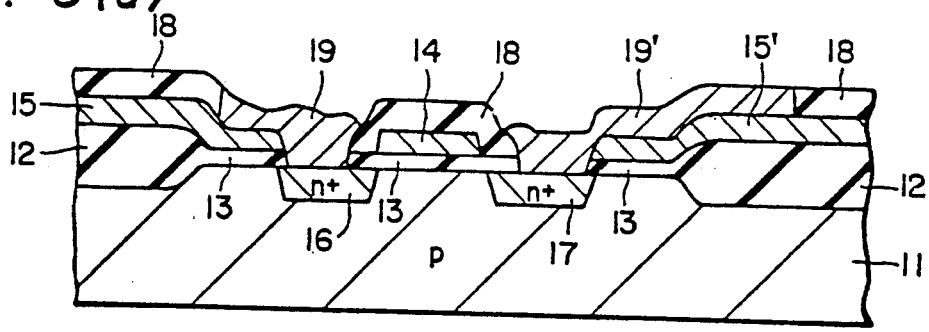

Referring to FIG. 8(d), a second polycrystalline silicon layer is deposited on the whole surface of the substrate 11, and is doped with phosphorus ions of a relatively small concentration. Then, unnecessary portions of the polycrystalline silicon are removed by the patterning. Thus, there are formed second polycrystalline silicon wiring layers 19, 19' to connect the source region 16 and the drain region 17 to the first polycrystalline silicon wiring layers 15, 15'.

Referring to FIG. 8(e), the first polycrystalline silicon wiring layer 15' is selectively exposed and, then, a PSG (phosphorus silicate glass) film 20 is deposited on the whole surface of the p-type substrate 11 to form a second interlayer insulation film (or passivation film).

Referring to FIG. 8(f), portions of the second interlayer insulation film 20 are selectively removed, and an aluminum wiring (third wiring) 21 which connects to the second polycrystalline silicon wiring layer is formed by vaporizing aluminum.

According to the present invention which makes use of a polycrystalline silicon wiring layer (second polycrystalline silicon wiring layer) in addition to the gate wiring layer (first polycrystalline silicon wiring layer) and electrode wiring of aluminum as mentioned above, it is possible to connect the first polycrystalline silicon wiring layer to a semiconductor region such as source region or drain region selectively formed in the substrate via the second polycrystalline silicon wiring layer. Therefore, there is no need to deeply form the semiconductor region, or to increase the distance between the gate wiring 14 and the first polycrystalline silicon wiring layers 15, 15', or between the gate wiring 14 and the second polycrystalline silicon wiring layers 19, 19'. Consequently, the degree of integration of the semiconductor devices can be increased. Further, since aluminum is not directly connected to the diffusion layer, there takes place no Al-Si reaction which destroys the pn junction.

FIG. 9 is a plan view of a static memory cell according to the present invention, which constitutes the circuit of the memory cell of FIG. 5. In FIG. 9, portions surrounded by a dot-dash line serve as active regions that are surrounded by the field insulation film 12, most of the regions thereof being diffusion regions (source and drain regions). A portion of the diffusion region is connected to ground line GND.

A solid line 14 denotes a first polycrystalline silicon wiring layer (gate wiring layer). A portion of the active region which crosses the wiring layer 14 works as a channel portion 22. MOS memory portions $Q_1$, $Q_2$, $Q_3$ and $Q_4$ are thus formed. A portion surrounded by a solid line 19 denotes a second polycrystalline silicon wiring layer which is connected to the first polycrystalline silicon wiring layer 14 via diffusion regions of $Q_1$ and $Q_2$, and a contact portion. Portions of the second polycrystalline silicon wiring layer 19 serve as high resistances $R_1$, $R_2$, and are inserted between $Q_3$ and $Q_4$ and are connected to the power supply $V_{CC}$. Portions $D_1$, $D_2$ surrounded by a broken line serve as data lines consisting of an aluminum wiring 21, and are connected to the diffusion regions of $Q_1$ and $Q_2$ via a contact portion of the second polycrystalline silicon layer that is superposed on the diffusion region.

In the thus constructed memory cell, the second polycrystalline silicon wiring layer is used for the power supply. Therefore, the impurities are doped in such small amounts that they do not affect the diffusion region. Accordingly, the depth of the source and drain regions is reduced, and the channel length of the gate portion is reduced to increase the degree of integration.

FIGS. 10(a) to 10(f) are section views showing the steps in a process for producing an MOSFET which constitutes the memory of FIG. 5 according to another embodiment of the present invention.

Figure 10A:
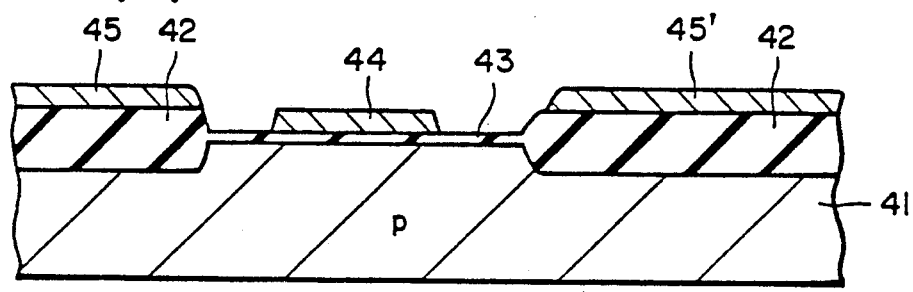
FIGS. 10(a) to 10(f) are section views showing the steps in a process for producing the MOSFET according to another embodiment of the present invention.

Referring to FIG. 10(a), a field SiO$_2$ film 42 is formed on one main surface of a p-type silicon substrate 41 by the low temperature selective oxidation method, and an SiO$_2$ film (gate insulation film) 43 having a thickness smaller than that of the field SiO$_2$ film 42 is formed on the surface of the active region surrounded by the field SiO$_2$ film 42. Then, polycrystalline silicon is deposited on the whole surfaces of the field SiO$_2$ film 42 and the gate SiO$_2$ film 43, and is doped with phosphorus ions of a relatively high concentration to reduce its resistance. The polycrystalline silicon is then subjected to the selective photoetching to form a polycrystalline silicon gate 44 and first-layer polycrystalline silicon wirings 45, 45'. In this case, the polycrystalline silicon wirings 45, 45' are not permitted to stretch onto the gate SiO$_2$ film 43.

Figure 10B:
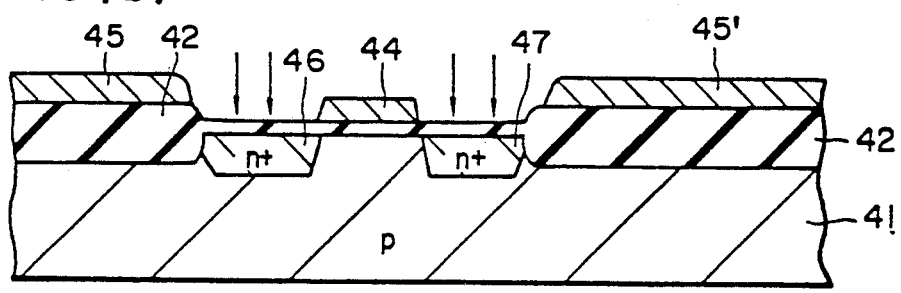

Referring to FIG. 10(b), n-type impurities are introduced into the surface of the p-type silicon substrate 41 with the polycrystalline silicon gate 44 and the field SiO$_2$ film 42 as a mask, thereby to form, in the p-type substrate, a semiconductor region that forms a pn junction with respect to the substrate. For example, n-type impurity ions such as phosphorus ions or arsenic ions are introduced into the p-type silicon substrate 41 by the ion injection, followed by annealing (heat treatment) to form the n$^+$-type source region 46 and drain region 47 having a desired depth in the p-type silicon substrate 41.

Figure 10C:
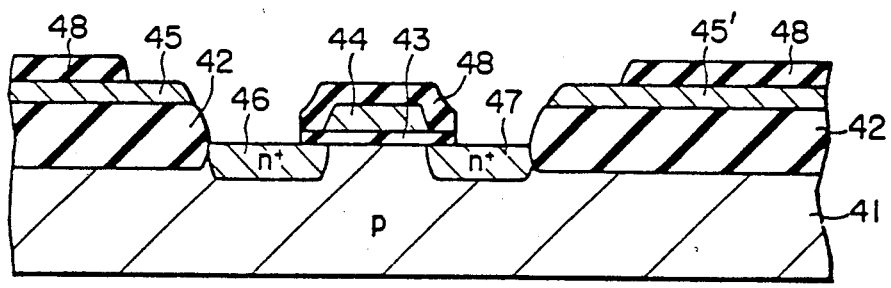

Referring to FIG. 10(c), an SiO$_2$ film 48 is formed as a first interlayer insulation film on the whole surface of the p-type substrate 41 by the thermal oxidation method or the CVD (chemical vapor deposition) method. Then, portions of the surface of the source region 46 and the drain region 47 are exposed by the contact photoetching. In this case, portions of the first polycrystalline silicon wiring layers 45, 45' are also exposed.

Figure 10D:
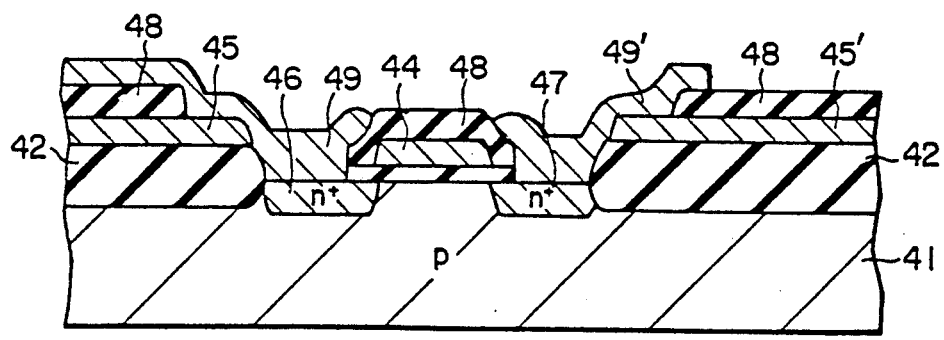

Referring to FIG. 10(d), a second polycrystalline silicon layer is deposited on the whole surface of the substrate 41, and is doped with phosphorus ions of a relatively small concentration. Thereafter, unnecessary portions of the polycrystalline silicon are removed by patterning. Thus, there are formed second polycrystalline silicon wiring layers 49, 49' to connect the source region 46 to the drain region 47, and to connect the first polycrystalline silicon wiring layers 45, 45' together.

Figure 10E:
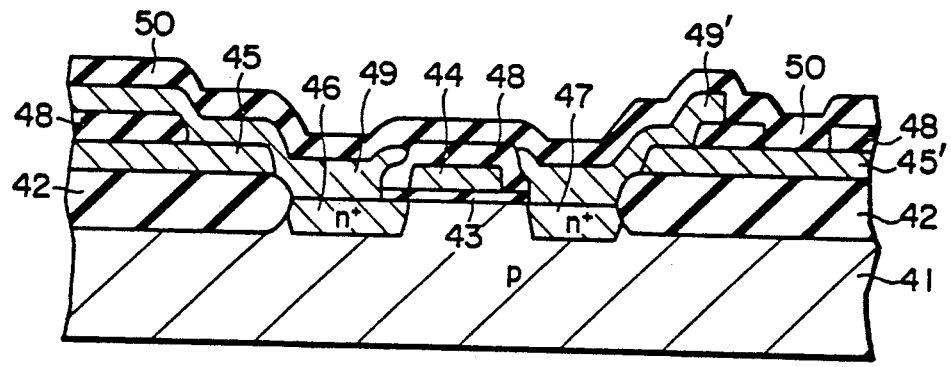

Referring to FIG. 10(e), the first polycrystalline silicon wiring layer 45' is selectively exposed, and a PSG (phosphorus silicate glass) film 50 is deposited on the whole surface of the p-type substrate 41 to form a second interlayer insulating film (or passivation film).

Figure 10F:
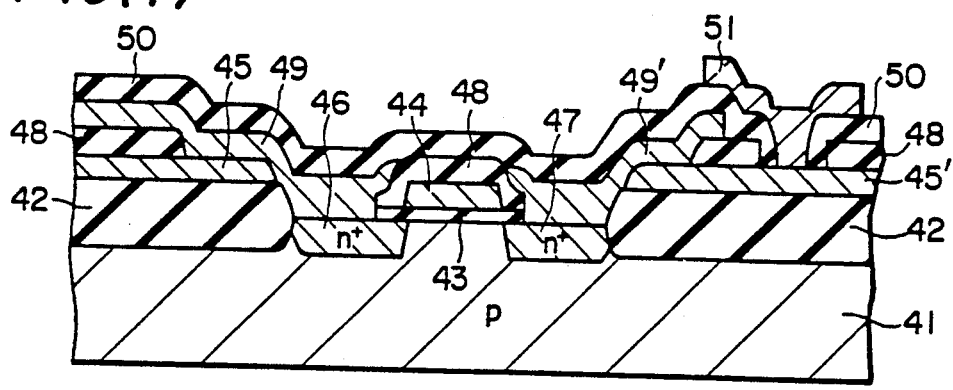

Referring to FIG. 10(f), a portion of the second interlayer insulation film 50 is selectively removed, and an aluminum wiring (third wiring) 51 which connects to the first polycrystalline silicon wiring layer 45' is formed by vaporizing aluminum.

According to the above-mentioned embodiment, the first polycrystalline silicon wiring layers 45, 45' are not permitted to stretch onto the gate SiO$_2$ film 43, but are terminated on the thick field SiO$_2$ film 42. Therefore, the areas of the source region 46 and the drain region 47 can be reduced. In other words, the degree of integration of memory cells can be increased.

FIGS. 11(a) to 11(f) illustrate a process when the present invention is adapted to the manufacture of a complementary MOSIC. This will be described below for each of the manufacturing steps.

Figure 11A:
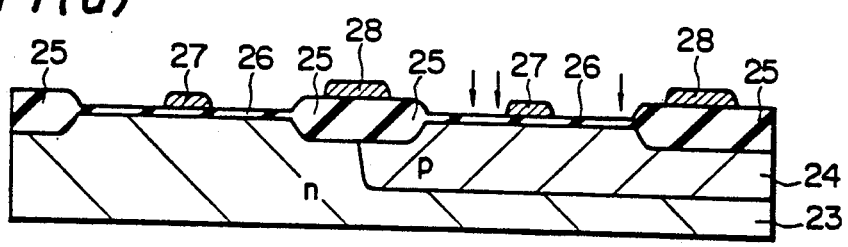
FIGS. 11(a) to 11(f) are section views showing the steps in a process for producing a CMOSIC according to the present invention.

Referring, first, to FIG. 11(a), boron ions are injected into a portion of the surface of an n-type silicon substrate 23 to form a p-type well region 24. A field SiO$_2$ film 25 is selectively formed on the surface of the n-type substrate 23 and the well region 24. Then, an SiO$_2$ film 26 of a thickness of about 380 angstroms is formed by gate oxidation on the surface of the n-type substrate 23 and the well region 24 that are surrounded by the field SiO$_2$ film 25. Then, the polycrystalline silicon is deposited to a thickness of about 3500 angstroms, and is doped with phosphorus ions (at 1000° C., for 5 minutes, 20 minutes and 5 minutes). A polycrystalline silicon gate 27 and a first polycrystalline silicon wiring layer 28 are formed by photoetching the polycrystalline silicon.

Figure 11B:
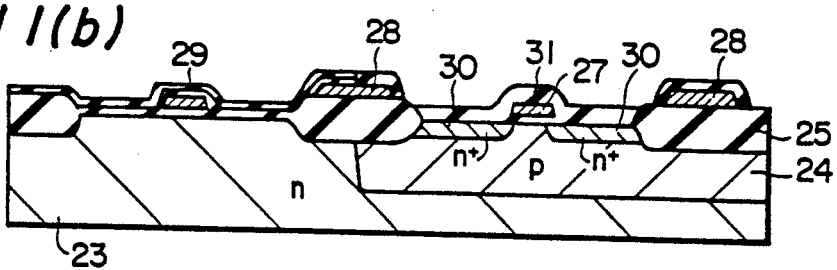

Referring to FIG. 11(b), the surfaces of the polycrystalline silicon gate 27 and the first polycrystalline silicon wiring layer 28 are lightly oxidized at a temperature of 850° C., and an Si$_3$N$_4$ is deposited on the whole surface of the substrate to a thickness of 1000 angstroms. Thereafter, only the Si$_3$N$_4$ is selectively removed by etching from the surface of the p-type well region 24. Namely, the Si$_3$N$_4$ film 29 is left on the surface of the n-type substrate 23 on which the p-type well region 24 has not been formed. Arsenic ions are introduced into the p-type well region by the injection method using the Si$_3$N$_4$ film 29 as a mask. Thereafter, an n$^+$-type source region or drain region 30 is formed by the annealing. Then, by using the Si$_3$N$_4$ film 29 as a mask for selective oxidation, the low-temperature selective oxidation is effected to increase the thickness of the SiO$_2$ film 31 on the surfaces of the polycrystalline silicon gate 27, first polycrystalline silicon wiring layer 28, and on the surface of the source or drain region 30.

Figure 11C:
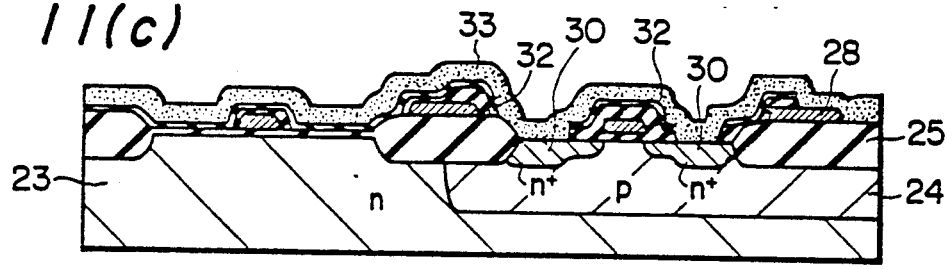

Referring to FIG. 11(c), the Si$_3$N$_4$ film 29 is removed by hot phosphoric acid, and an Si$_3$N$_4$ film 32 is newly deposited to a thickness of about 500 angstroms. A portion of the source or drain region 30 is exposed by effecting the contact photoetching onto the Si$_3$N$_4$ film 32 and the underlying SiO$_2$ film 31. A PSG (phosphorus silicate glass) film 33 is then deposited on the whole surfaces of the n-type substrate 11 and the well region 24, and is annealed at 1000° C. in a nitrogen atmosphere.

Figure 11D:
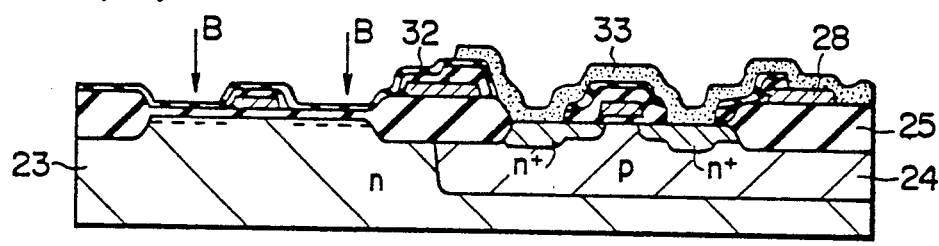

Referring to FIG. 11(d), a portion of the PSG film 33 is removed by etching, and boron ions are introduced into the p-channel side (n-type substrate) by the ion injection method through the Si$_3$N$_4$ film 32. Thus, the p-type source and drain regions 37 are formed.

Figure 11E:
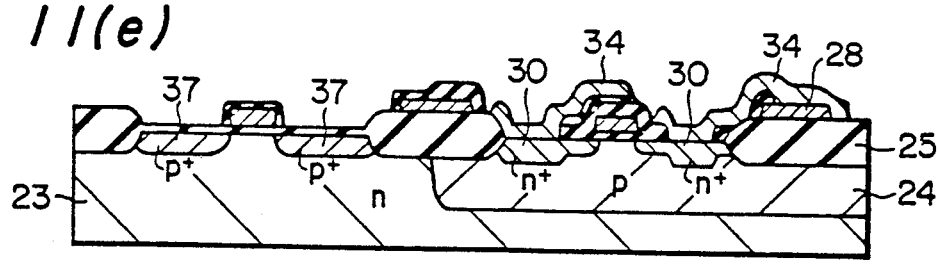

Referring to FIG. 11(e), the PSG film 33 is removed to expose the surface of the n$^+$-type diffusion region 30 and the first polycrystalline silicon wiring layer 28 on the n-channel side (p-well side). A second polycrystalline silicon layer 34 (3500 angstroms) is deposited on the p-channel side and on the n-channel side, and the polycrystalline silicon layer 34 is doped with phosphorus ions while masking the second polycrystalline silicon layer 34 on the p-channel side. Thereafter, unnecessary portions of the polycrystalline silicon layer 34 are removed by photoetching. Thus, the second polycrystalline silicon wiring 34 is formed which connects to the n$^+$-type region 30 and to the first polycrystalline silicon wiring layer 28.

Figure 11F:
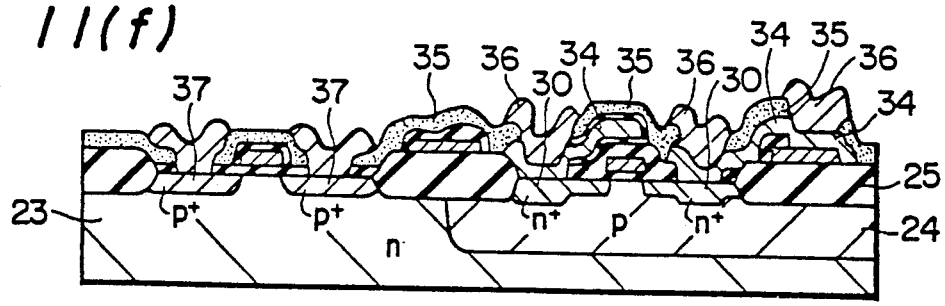

Referring to FIG. 11(f), the second polycrystalline silicon wiring layer 34 is lightly oxidized, a PSG film 35 is deposited thereon to a thickness of about 6000 angstroms, followed by annealing in a nitrogen atmosphere, and the films are selectively removed by the contact photoetching. Then, aluminum is deposited followed by patterning to form an aluminum wiring (electrode) 36 that connects to the p$^+$-type diffusion region 37 and to the second polycrystalline silicon wiring layer 34.

In the CMOS device obtained by the above-mentioned process, the aluminum wiring 36 is connected at a portion to the diffusion region (p$^+$) 37, and is connected at another portion to the diffusion region (n$^+$) 30 via the second polycrystalline silicon wiring layer 34. At still another portion, furthermore, the aluminum wiring 36 is connected to the first polycrystalline silicon wiring layer 28 via the second polycrystalline silicon wiring layer 34.

According to the present invention as mentioned in the foregoing, the first wiring layer or the third aluminum wiring layer is connected to the diffusion regions via the second wiring layer. Therefore, increased freedom is provided for laying out the wiring. Consequently, the degree of integrating the semiconductor devices can be increased, for example, by 10 to 20%.

The present invention can be effectively adapted to the MOS memory devices having polycrystalline silicon wirings of a multi-layer construction, and especially to static memory devices manufactured by the CMOS process.

What is claimed is:

1. A semiconductor device having a plurality of memory cells, the memory cells having MISFETs, comprising:
    a semiconductor substrate of a first conductivity type;
    a first insulating film formed on a main surface of said semiconductor substrate so as to surround an area of said main surface, said area providing the surface of an active region in a portion of the semiconductor substrate;
    a second insulating film, of a thickness smaller than said first insulating film, formed on the surface of said active region;
    a first conductive layer selectively formed on part of said second insulating film so as to traverse said active region, said first conductive layer serving as gate electrodes of MISFETs of said memory cells;
    a second conductive layer selectively formed so as to extend at least over part of said first insulating film, said second conductive layer being separated from said first conductive layer;
    a first semiconductor region, of a second conductivity type opposite to the first conductivity type, formed in a first surface portion of said active region which is surrounded by said first conductive layer, said second conductive layer and said first insulating film, said second conductive layer not being in direct contact with said first semiconductor region; a second semiconductor region, of said second conductivity type, formed in a second surface portion of said active region which is surrounded by said first conductive layer and said first insulating film and which is positioned on the opposite side of said first conductive layer from said first surface portion;
    a third insulating film which at least partly covers said first and second conductive layers and has at least one hole so formed that a portion of said first semiconductor region and a portion of said second conductive layer are exposed; and
    a third conductive layer, of polycrystalline silicon, which is formed in said hole and makes a connection between said first semiconductor region and said second conductive layer.

2. A semiconductor device according to claim 1, wherein said second conductive layer is selectively formed on part of said second insulating film and extends therefrom over part of said first insulating film.

3. A semiconductor device according to claim 2, wherein said third conductive layer fills the whole area of said hole in said third insulating film.

4. A semiconductor device according to claim 1, wherein said memory cells include load resistors, and wherein said third conductive layer also forms said load resistors of the memory cells.

5. A semiconductor device according to claim 1, wherein said first and second conductive layers are polycrystalline silicon layers.

6. A semiconductor device according to claim 5, wherein said first and second conductive polycrystalline silicon layers are doped with impurities of the second conductivity type at a concentration sufficient to decrease the resistance thereof.

7. A semiconductor device according to claim 1, wherein said first conductive layer and said second conductive layer are formed from the same level conductive material layer.

8. A semiconductor device according to claim 7, wherein each memory cell has a plurality of MISFETs, and wherein said second conductive layer is formed integrally with the gate electrode of one of the plurality of MISFETs of each memory cell.

9. A semiconductor device according to claim 8, wherein said semiconductor device is a static random access memory device.

10. A semiconductor device according to claim 1, wherein said third conductive layer fills the whole area of said hole in said third insulating film.

11. A semiconductor device having a memory cell of a static random access memory, comprising:
    a semiconductor substrate of a first conductivity type;
    a first insulating film formed on a main surface of said semiconductor substrate so as to surround an area of said main surface, said area providing the surface of an active region in a portion of said semiconductor substrate;
    a second insulating film, of a thickness smaller than said first insulating film, formed on the surface of said active region;
    a first conductive layer selectively formed on part of said second insulating film so as to traverse said active region, said first conductive layer serving as a gate electrode of an MISFET of said memory cell;
    a second conductive layer selectively formed so as to extend at least over part of said first insulating film, said second conductive layer selectively formed so as to extend at least on part of said second insulating film, said second conductive layer being separated from said first conductive layer serving as a gate electrode of an MISFET of said memory cell;
    a first semiconductor region, of a second conductivity type opposite to the first conductivity type, formed in a first surface portion of said active region which is surrounded by said first conductive layer, said second conductive layer and said first insulating film;
    a second semiconductor region, of said second conductivity type, formed in a second surface portion of said active region which is surrounded by said first conductive layer and said first insulating film and which is positioned on an opposite side of said first conductive layer from said first surface portion;
    a third insulating film which at least partly covers said first and second conductive layers and has at least one hole so formed that a portion of said first semiconductor region and a portion of said second conductive layer are exposed; and
    a third conductive layer, of polycrystalline silicon, which is formed in said hole and makes a connection between said first semiconductor region and said second conductive layer.

12. A semiconductor device according to claim 11, wherein said third conductive layer fills the whole area of said hole in said third insulating film.

13. A semiconductor device according to claim 11, wherein said memory cell includes load resistors, and wherein said third conductive layer also forms said load resistors of the memory cell.

14. A semiconductor device according to claim 11, wherein said first conductive layer and said second conductive layer are formed from the same level conductive material layer.

15. A semiconductor device according to claim 14, wherein said first conductivity type is p-type and said second conductivity type is n-type.

16. A semiconductor device according to claim 15, wherein said first insulating film is a field oxide film.

17. A semiconductor device according to claim 11, wherein said first semiconductor region constitutes one of the source and drain regions of said MISFET having the first conductive layer as the gate electrode.

18. A semiconductor device according to claim 17, wherein said second semiconductor region constitutes the other of the source and drain regions of said MISFET having the first conductive layer as the gate electrode.

19. A semiconductor device having a memory cell of a static random access memory, comprising:
a semiconductor substrate of a first conductivity type;
a well region of a second conductivity type, opposite to the first conductivity type, which is selectively formed in a surface region of said semiconductor substrate, said well region having said memory cell provided therein, said memory cell including MISFETs and load elements;
a first insulating film formed on a main surface of said well region so as to surround an area of said main surface, said area providing the surface of an active region;
semiconductor elements provided in a surface region of said semiconductor substrate, wherein the semiconductor elements provided in the surface region of said semiconductor substrate form a peripheral circuit for said at least one memory cell, said semiconductor elements forming the peripheral circuit including complementary MISFETs;
a first conductive layer formed over said active region so as to traverse said active region, with a gate insulating film intervening between the first conductive layer and the active region, said first conductive layer serving as a gate electrode of an MISFET of said memory cell;
a second conductive layer formed so as to extend at least over part of said first insulating film and at least over part of said active region, with a second insulating film intervening between the second conductive layer and said active region, said second conductive layer being separated from said first conductive layer serving as a gate electrode of an MISFET of said memory cell, said second insulating film and said gate insulating film each having a thickness smaller than that of said first insulating film;
a first semiconductor region, of the first conductivity type opposite to the second conductivity type, formed in a first surface portion of said active region which is surrounded by said first conductive layer, said second conductive layer and said first insulating film;
a second semiconductor region, of said first conductivity type, formed in a second surface portion of said active region which is surrounded by said first conductive layer and said first insulating film and which is positioned on an opposite side of said first conductive layer from said first surface portion;
a third insulating film which at least partly covers said first and second conductive layers and has at least one hole so formed that a portion of said first semiconductor region and a portion of said second conductive layer are exposed; and
a third conductive layer, of polycrystalline silicon, which is formed in said hole and makes a connection between said first semiconductor region and said second conductive layer, said third conductive layer being electrically connected to one of said load elements.

20. A semiconductor device according to claim 19, wherein said third conductive layer fills the whole area of said hole in said third insulating film.

21. A semiconductor device according to claim 19, wherein said first conductive layer and said second conductive layer are formed from the same level conductive material layer.

22. A semiconductor device according to claim 21, wherein said first conductivity type is n-type and said second conductivity type is p-type.

23. A semiconductor device according to claim 22, wherein said first insulating film is a field oxide film.

24. A semiconductor device according to claim 19, wherein said first conductive layer extends in a direction substantially perpendicular to a direction in which said second conductive layer extends.

25. A semiconductor device according to claim 24, further comprising a pair of data lines, wherein said pair of data lines extend in substantially a same direction as said second conductive layer extends.

26. A semiconductor device according to claim 19, further including a fourth conductive layer forming said load elements of said memory cell and forming a power supply line, whereby said load elements and power supply line are integrally formed.

27. A semiconductor device according to claim 19, wherein said first semiconductor region constitutes one of the source and drain regions of said MISFET having the first conductive layer as the gate electrode.

28. A semiconductor device according to claim 23, wherein said second semiconductor region constitutes the other of the source and drain regions of said MISFET having the first conductive layer as the gate electrode.

29. A semiconductor device according to claim 19, further comprising a power supply line extending over the semiconductor substrate and supplying a first fixed potential to said memory cell, and wherein said load elements are coupled to said power supply line.

30. A semiconductor device according to claim 29, further comprising a ground supply line disposed in said well region of the semiconductor substrate and supplying a ground potential to said memory cell.

31. A semiconductor device according to claim 29, wherein said load elements serve as load resistors, and said load elements and said third conductive layer are formed integrally.

32. A semiconductor device according to claim 31, wherein said third conductor layer and said power supply line are formed integrally.

33. A semiconductor device according to claim 32, wherein said first conductive layer and second conductive layer are made from a first level conductive material layer, and said load elements and power supply line are made integrally from a second level conductive material layer of polycrystalline silicon.

34. A semiconductor device according to claim 19, wherein said memory cell includes, as said MISFETs, switching MISFETs and driver MISFETs.

35. A semiconductor device according to claim 34, wherein said first semiconductor region serves as one of a source region or a drain region of one of said switching MISFETs, and said second semiconductor region serves as the other of the source region or drain region of said one of the switching MISFETs.

36. A static random access memory device comprising:

A semiconductor substrate of a first conductivity type;

a well region of a second conductivity type, opposite to the first conductivity type, which is selectively formed in a surface region of said semiconductor substrate;

a first insulating film formed on a main surface of said well region so as to surround an area of said main surface, said area providing the surface of an active region;

a peripheral circuit including complementary MISFETs, said complementary MISFETs being formed in a surface region of said semiconductor substrate;

a plurality of memory cells formed in said well region, each memory cell having MISFETs and a pari of load elements, said load elements having a high-resistance portion comprised of polycrystalline silicon;

a first conductive layer formed over said active region so as to traverse said active region, with a gate insulating film intervening between the first conductive layer and active region, said first conductive layer serving as a gate electrode of an MISFET of said memory cell;

a second conductive layer formed so as to extend at least over part of said first insulating film and at least over part of said active region, with a second insulating film intervening between the second conductive layer and the active region, said second conductive layer being separated from said first conductive layer serving as a gate electrode of an MISFET of said memory cell, said second insulating film and said gate insulating film each having a thickness smaller than that of said first insulating film;

a first semiconductor region, of the first conductivity type opposite to the second conductivity type, formed in a first surface portion of said active region which is surrounded by said first conductive layer, said second conductive layer and said first insulating film;

a second semiconductor region, of said first conductivity type, formed in a second surface portion of said active region which is surrounded by said first conductive layer and said first insulating film and which is positioned on an opposite side of said first conductive layer from said first surface portion;

a third insulating film which at least partly covers said first and second conductive layers and has at least one hole so formed that a portion of said first semiconductor region and a portion of said second conductive layer are exposed;

a third conductive layer, of polycrystalline silicon, which is formed in said hole and makes a connection between said first semiconductor region and said second conductive layer;

a power supply line extending over the semiconductor substrate, the high-resistance portion of the load elements making an electrical connection between said power supply line and said third conductive layer.

37. A static random access memory device according to claim 36, wherein said third conductive layer fills the whole area of said hole in said third insulating film.

38. A static random access memory device according to claim 36, wherein said first conductivity type is n-type and said second conductivity type is p-type.

39. A static random access memory device according to claim 38, wherein said first insulating film is a field oxide film.

40. A static random access memory device according to claim 39, wherein said first conductive layer extends in a direction substantially perpendicular to a direction in which said second conductive layer extends.

41. A static random access memory device according to claim 40, further comprising a pair of data lines, and wherein said pair of data lines extend in substantially a same direction as said second conductive layer extends.

42. A static random access memory device according to claim 41, wherein one of said pair of data lines is electrically connected to said second semiconductor region.

43. A static random access memory device according to claim 36, wherein said first semiconductor region constitutes one of the source and drain regions of said MISFET having the first conductive layer as the gate electrode.

44. A static random access memory device according to claim 43, wherein said second semiconductor region constitutes the other of the source and drain regions of said MISFET having the first conductive layer as the gate electrode.

45. A static random access memory device according to claim 36, wherein the MISFETs of each memory cell are switching MISFETs and driver MISFETs, wherein the first conductive layer serves as a gate electrode of a switching MISFET of the memory cell, and wherein the second conductive layer is coupled to a gate electrode of a driver MISFET of said memory cell.

46. A static random access memory device according to claim 45, wherein said first semiconductor region serves as one of a source region or a drain region of one of said switching MISFETs, and said second semiconductor region serves as the other of the source region or drain region of said one of the switching MISFETs.

47. A static random access memory device according to claim 45, wherein said driver and switching MISFETs are n-channel MISFETs in P-type wells.

48. A static random access memory device according to claim 36, wherein said high-resistance portion has a higher resistivity than that of said third conductive layer.

49. A static random access memory device according to claim 48, wherein said high-resistance portion has a lower doping concentration than that of said third conductive layer.

50. A static random access memory device according to claim 36, wherein said high-resistance portion and said power supply line are formed integrally.

51. A static random access memory device according to claim 36, further comprising data lines which extend over a semiconductor substrate and which are constituted as individual sets of complementary data lines, each set including a pair of complementary data lines and each data line of a corresponding pair of complementary data lines being coupled to an identical memory cell, with one of said complementary data lines being electrically connected to said second semiconductor region.

52. A static random access memory device comprising:
a semiconductor substrate of a first conductivity type;
a well region of a second conductivity type opposite to the first conductivity type, which well region is selectively formed in a surface region of said semiconductor substrate;
a plurality of memory cells formed in said well region, each memory cell having MISFETs;
a first insulating film formed on a main surface of said well region so as to surround an area of said main surface, said area providing the surface of an active region;
semiconductor elements provided in a surface region of said semiconductor substrate, wherein the semiconductor elements provided in the surface region of said semiconductor substrate form a peripheral circuit for said plurality of memory cells, said semiconductor elements forming the peripheral circuit including complementary MISFETs;
a first conductive layer formed over said active region so as to traverse said active region, with a gate insulating film intervening between the first conductive layer and said active region, said first conductive layer serving as a gate electrode of a MISFET of said memory cell;
a second conductive layer formed so as to extend at least over part of said first insulating film and at least over part of said active region, with a second insulating film intervening between the second conductive layer and said active region, said second conductive layer being separated from said first conductive layer serving as a gate electrode of a MISFET of said memory cell, said second insulating film and said gate insulating film having a thickness smaller than that of said first insulating film;
a first semiconductor region, of the first conductivity type opposite to the second conductivity type, formed in a first surface portion of said active region which is surrounded by said first conductive layer, said second conductive layer and said first insulating film, the first semiconductor region serving as either the source region or the drain region of a MISFET of a memory cell;
a second semiconductor region, of said first conductivity type, formed in a second surface portion of said active region which is surrounded by said first conductive layer and said first insulating film and which is positioned on an opposite side of said first conductive layer from said first surface portion, the second semiconductor region serving as the other of the source region or the drain region of the MISFET of the memory cell;
a third insulating film which at least partly covers said first and second conductive layers and has at least one hole so formed that a portion of said first semiconductor region and a portion of said second conductive layer are exposed; and
a third conductive layer, comprised of polycrystalline silicon, which is formed in said hole and makes a connection between said first semiconductor region and said second conductive layer, said third conductive layer serving as a load resistor means for each of said memory cells and as a power supply line.

53. A static random access memory device according to claim 52, wherein said third conductive layer fills the whole area of said hole in said third insulating film.

54. A static random access memory device according to claim 52, wherein said first conductivity type is n-type and said second conductivity type is p-type.

55. A static random access memory device according to claim 54, wherein said first insulating film is a field oxide film.

56. A static random access memory device according to claim 52, wherein each memory cell has switching MISFETs, wherein the first conductive layer serves as a gate electrode of a switching MISFET of the memory cell; wherein the second conductive layer is coupled to a gate electrode of a driver MISFET of said memory cell; and wherein the first and second semiconductor regions respectively serve as one and the other of the source and drain regions of the switching MISFET of the memory cell.

57. A static random access memory device according to claim 52, wherein said load resistor means and said third conductive layer are formed integrally.

58. A static random access memory device according to claim 57, wherein the first conductive layer and the second conductive layer are made from a first level conductive material layer including a polycrystalline silicon layer, and said load resistor means and third conductive layer are made from a second level conductive material layer.

59. A static random access memory device according to claim 52, wherein each of the memory cells also includes a pair of load elements, and wherein the first conductive layer extends in a direction substantially perpendicular to the direction in which the second conductive layer extends.

60. A semiconductor device according to claim 25, wherein one of said pair of data lines is electrically connected to said second semiconductor region.

61. A semiconductor device comprising:
a semiconductor substrate of a p-type conductivity;
a word line extending over said semiconductor substrate;
a pair of data lines extending over said semiconductor substrate;
a power supply line extending over said semiconductor substrate;
a ground supply line extending over said semiconductor substrate;
a first insulating film formed on a main surface of said semiconductor substrate so as to surround an area of said main surface, said area providing the surface of an active region in a portion of said semiconductor substrate;

memory cells formed on the main surface of said semiconductor substrate, each of said memory cells having first, second, third, and fourth MISFETs, and a pair of load resistors;

a first conductive layer serving as gate electrodes of said first and second MISFETs, said first conductive layer being formed over said active region so as to traverse said active region, with a gate insulating film intervening between the first conductive layer and the active region, said first conductive layer being connected with said word line;

said first MISFET being electrically coupled between a drain semiconductor region of said third MISFET and one of said pair of data lines;

said second MISFET being electrically coupled between a drain semiconductor region of said fourth MISFET and the other of said pair of data lines.

a second conductive layer serving as gate electrodes of said third and fourth MISFETs, said second conductive layer being formed so as to extend at least over part of said first insulating film and at least over part of said active region, with a second insulating film intervening between the second conductive layer and said active region, said second conductive layer being separated from said first conductive layer, said second insulating film and said gate insulating film each having a thickness smaller than that of said first insulating film;

a first semiconductor region, of n-type conductivity, formed in a first surface portion of said active region which is surrounded by said first conductive layer, said second conductive layer and said first insulating film;

a second semiconductor region, of n-type conductivity formed in a second surface portion of said active region which is surrounded by said first conductive layer and said first insulating film and which is positioned on an opposite side of said first conductive layer from said first surface portion;

a third insulating film which at least partly covers said first and second conductive layers and has at least one hole so formed that a portion of said first semiconductor region and a portion of said second conductive layer are exposed;

a third conductive layer, of polycrystalline silicon, which is formed in said hole and makes a connection between said first semiconductor region and said second conductive layer;

each of said gate electrodes of said third and fourth MISFETs being electrically connected to said drain semiconductor region of the other of said third and fourth MISFETs;

one of said pair of load resistors being connected between the drain semiconductor region of said third MISFET and said power supply line, and the other of said pair of load resistors being connected to the drain semiconductor region of said fourth MISFET and said power supply line;

wherein said first conductive layer and second conductive layer are made from a first level conductive material layer, and said load resistors and power supply line are made integrally from a second level conductive material layer of polycrystalline silicon;

a source semiconductor region of each of said third and fourth MISFETs being connected with said ground supply line; and a peripheral circuit including complementary MISFETs.

* * * * *